United States Patent [19]
Smith et al.

[11] Patent Number: 5,812,605
[45] Date of Patent: Sep. 22, 1998

[54] MULTI-CHANNEL DIGITAL TRANSCEIVER AND METHOD

[75] Inventors: Paul Fielding Smith, North Richland Hills, Tex.; John M. Smith, Elgin, Ill.; Alan P. Rottinghaus, Barrington, Ill.; Shelia Marie Rader, Wildwood, Ill.; Danny Thomas Pinckley, Arlington, Tex.; Yuda Yehuda Luz, Prairie View; Daniel Morris Lurey, Hoffman Estates, both of Ill.; Kevin Michael Laird, Haltom City, Tex.; Tony Kobrinetz, Hoffman Estates, Ill.; Robert C. Elder, McHenry, Ill.; Donald E. Bailey, Palatine, Ill.

[73] Assignee: Motorola, inc., Schaumburg, Ill.

[21] Appl. No.: 835,785

[22] Filed: Apr. 15, 1997

Related U.S. Application Data

[63] Continuation of Ser. No. 552,177, Nov. 2, 1995, abandoned, which is a continuation of Ser. No. 366,283, Dec. 29, 1994, Pat. No. 5,579,341.

[51] Int. Cl.$^6$ .................................................. H04L 27/20
[52] U.S. Cl. ......................... 375/308; 375/295; 375/299; 455/103; 332/100; 332/103; 332/106
[58] Field of Search ..................... 375/259, 260, 375/267, 295–299, 303, 306–308; 455/101, 103, 113, 118; 331/49; 332/100, 101, 103–104, 106, 108

[56] References Cited

U.S. PATENT DOCUMENTS

| | | | |
|---|---|---|---|
| 3,783,385 | 1/1974 | Dunn et al. ............................. | 375/267 |
| 3,783,413 | 1/1974 | Froment et al. .................... | 332/119 X |
| 3,991,277 | 11/1976 | Hirata ........................................ | 370/70 |
| 4,101,738 | 7/1978 | Bellanger et al. ........................ | 370/70 |
| 4,112,374 | 9/1978 | Steinbrecher ............................ | 455/6.2 |
| 4,206,320 | 6/1980 | Keasler et al. ............................ | 370/11 |

(List continued on next page.)

FOREIGN PATENT DOCUMENTS

95/12261  5/1995  WIPO.

OTHER PUBLICATIONS

Harris Semiconductor Digital Signal Processing Databook, "Numerically Controlled Oscillator/Modulator", HSP45116, pp. 5–26/5–40, Harris Corporation.

Fundamentals of Digital Image Processing by Anil K. Jain, University of California, Davis, 1989 by Prentice–Hall, Inc., pp. 155–159, 185–187.

"Robust Digital Filter Structures", 7–3 Cascade Form Digital Filter Structures, Handbook for Digital Signal Processing by Sanjit Mitra and James Kaiser, John Wiley & Sons 1993.

Hogenauer, Eugene B. "An Economical Class of Digital Filters for Decimation and Interpolation", IEEE Transactions on Acoustics, Speech and Signal Processing, vol. ASSP–29, No. 2.

ETSI–SMG, GSM 06.31, 4.0.0, Discontinuous Transmission (DTX) for Full Rate Speech Transmission Channels, Oct. 1992.

EIA/TIA/IS–95, Requirements for Base Station CDMA Operation, pp. 7–1/7–185, Appendix A Requirements for CDMA Service OptionsA–1/A–68.

*Primary Examiner*—Young T. Tse
*Attorney, Agent, or Firm*—Kenneth A. Haas

[57] ABSTRACT

A multi-channel digital transceiver (400) receives uplink radio frequency signals and converts these signals to digital intermediate frequency signals. Digital signal processing, including a digital converter module (426), is employed to select digital intermediate frequency signals received at a plurality of antennas (412) and to convert these signals to baseband signals. The baseband signals are processed to recover a communication channel therefrom. Downlink baseband signals are also processed and digital signal processing within the digital converter module (426) up converters and modulates the downlink baseband signals to digital intermediate frequency signals. The digital intermediate frequency signals are converted to analog radio frequency signals, amplified and radiated from transmit antennas (420).

5 Claims, 15 Drawing Sheets

U.S. PATENT DOCUMENTS

| | | | |
|---|---|---|---|
| 4,230,956 | 10/1980 | Steinbrecher | 327/122 |
| 4,237,551 | 12/1980 | Narasimha | 370/50 |
| 4,301,533 | 11/1981 | Acampora et al. | 455/103 X |
| 4,355,405 | 10/1982 | Ruys et al. | 375/275 |
| 4,492,962 | 1/1985 | Hansen | 342/369 |
| 4,514,760 | 4/1985 | Balaban et al. | 348/484 |
| 4,517,586 | 5/1985 | Balaban et al. | 348/572 |
| 4,616,364 | 10/1986 | Lee | 375/347 |
| 4,621,337 | 11/1986 | Cates et al. | 364/727 |
| 4,652,858 | 3/1987 | Kokubo et al. | 341/144 |
| 4,803,727 | 2/1989 | Holt et al. | 381/1 |
| 4,806,881 | 2/1989 | Ives et al. | 332/119 X |
| 4,825,448 | 4/1989 | Critchlow et al. | 375/308 X |
| 4,881,222 | 11/1989 | Goeckler et al. | 370/70 |
| 4,884,265 | 11/1989 | Schroeder et al. | 370/70 |
| 4,890,283 | 12/1989 | Tsinberg et al. | 370/84 |
| 4,893,316 | 1/1990 | Janc et al. | 375/271 |
| 4,962,510 | 10/1990 | McDavid et al. | 375/308 |
| 5,010,585 | 4/1991 | Garcia | 375/216 X |
| 5,101,501 | 3/1992 | Gilhousen et al. | 455/33 |
| 5,103,459 | 4/1992 | Gilhousen et al. | 375/205 |
| 5,109,390 | 4/1992 | Gilhousen et al. | 375/205 |
| 5,124,672 | 6/1992 | Kuisma | 332/119 X |
| 5,136,612 | 8/1992 | Bi | 375/205 |
| 5,159,608 | 10/1992 | Falconer et al. | 375/200 |
| 5,170,413 | 12/1992 | Hess et al. | 375/260 |
| 5,175,878 | 12/1992 | Davis et al. | 455/103 |
| 5,179,360 | 1/1993 | Suzuki | 375/308 X |
| 5,187,809 | 2/1993 | Rich et al. | 455/33.1 |
| 5,210,775 | 5/1993 | Takahara et al. | 375/308 |
| 5,220,557 | 6/1993 | Kelley | 370/50 |
| 5,220,583 | 6/1993 | Solomon | 375/328 |
| 5,224,119 | 6/1993 | Barabash et al. | 375/308 X |
| 5,224,122 | 6/1993 | Bruckert | 375/200 |
| 5,274,836 | 12/1993 | Lux | 375/259 |
| 5,278,837 | 1/1994 | Kelley | 370/120 |
| 5,287,543 | 2/1994 | Wolkstein | 455/103 X |
| 5,293,329 | 3/1994 | Wishart et al. | 364/724.13 |
| 5,295,153 | 3/1994 | Gudmundson | 375/205 |
| 5,299,192 | 3/1994 | Guo et al. | 370/70 |
| 5,309,479 | 5/1994 | Cheah | 375/306 X |
| 5,313,279 | 5/1994 | Wang et al. | 348/426 |
| 5,323,157 | 6/1994 | Ledzius et al. | 341/143 |
| 5,347,284 | 9/1994 | Volpi et al. | 342/356 |
| 5,373,532 | 12/1994 | Fujita et al. | 375/308 |
| 5,396,489 | 3/1995 | Harrison | 370/50 |
| 5,406,629 | 4/1995 | Harrison et al. | 380/34 |
| 5,412,352 | 5/1995 | Graham | 375/257 |

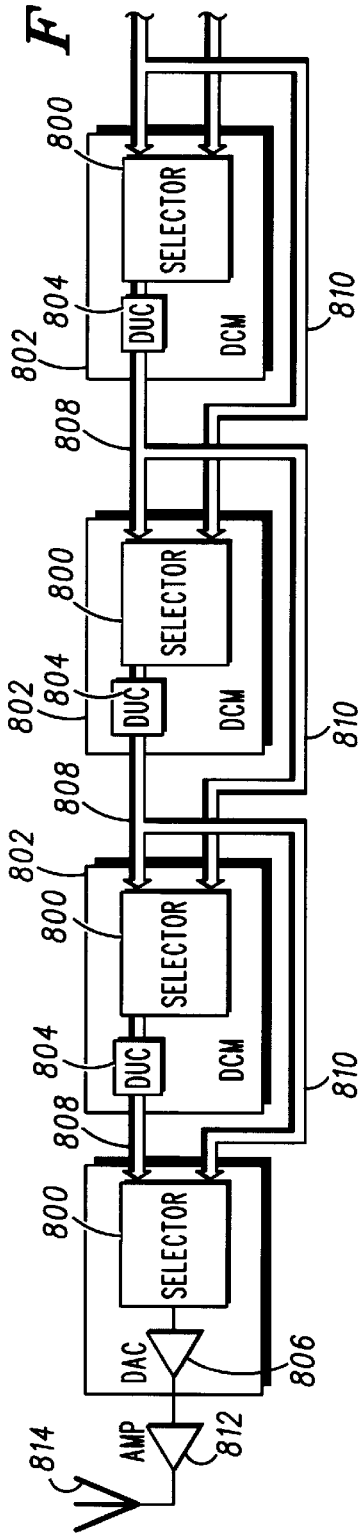
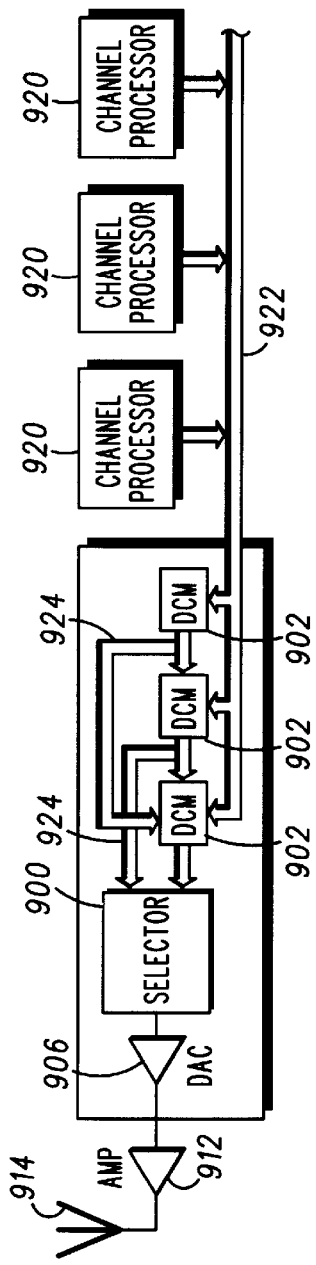
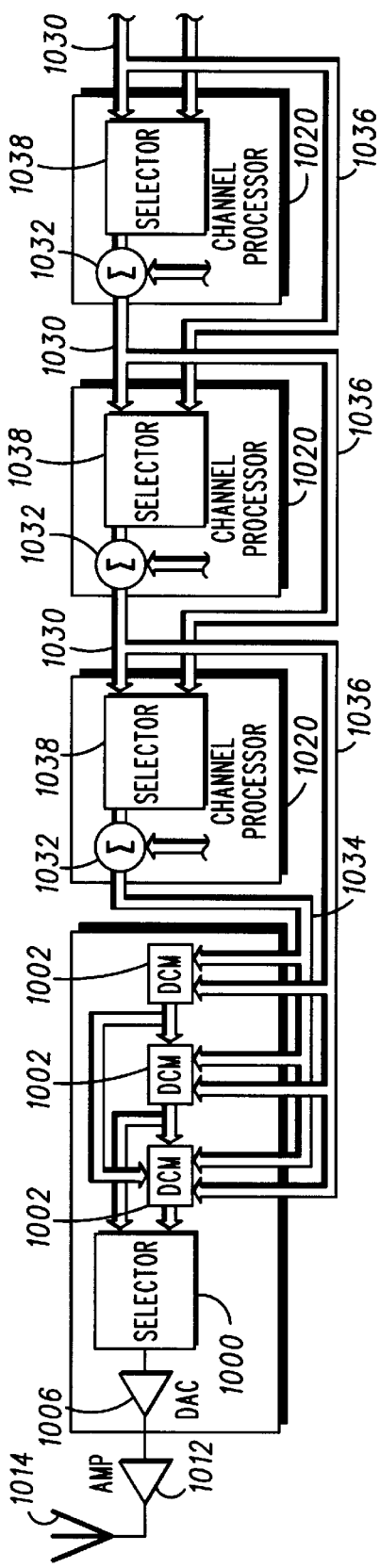
FIG.8
FIG.9
FIG.10

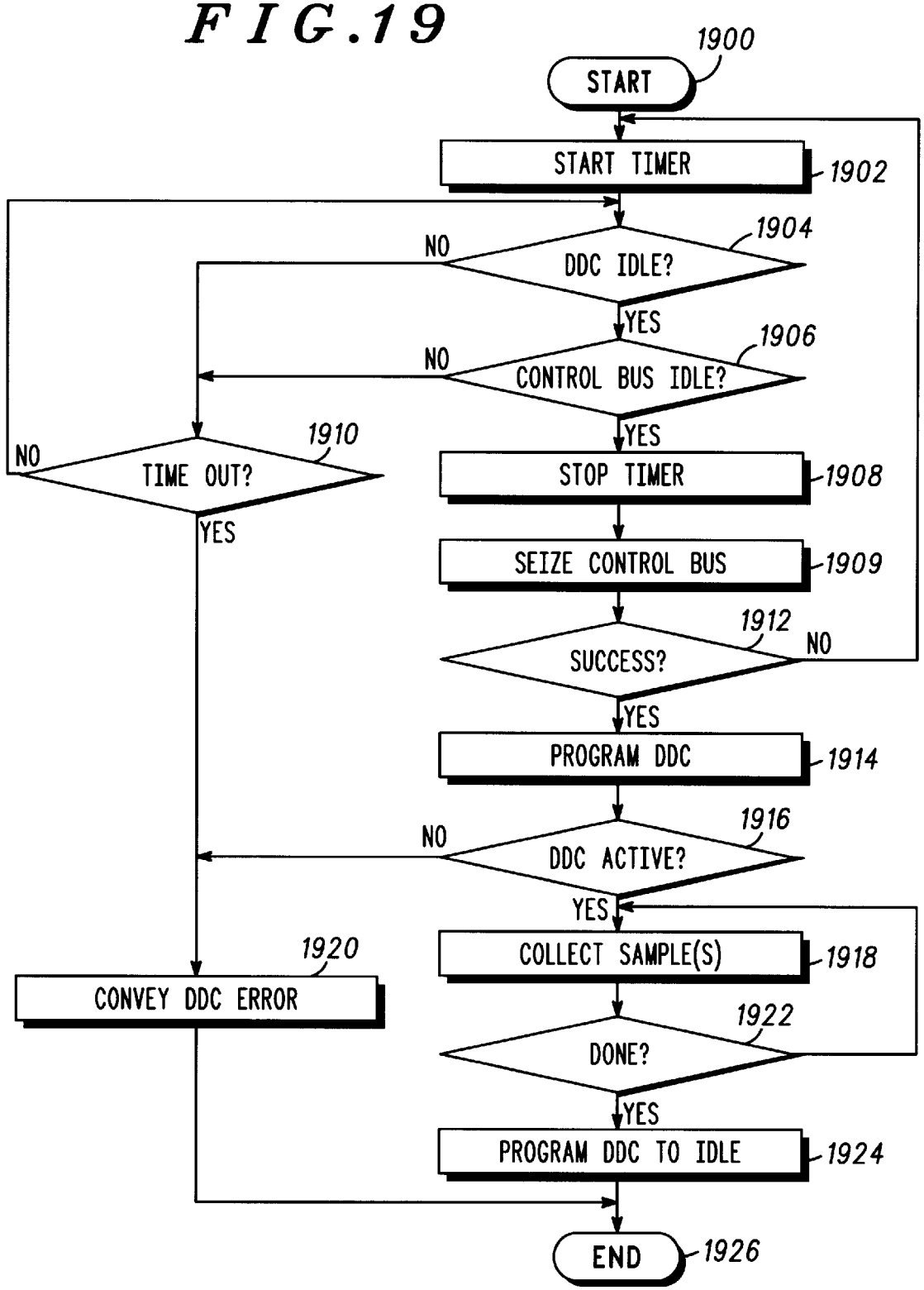

MULTI-CHANNEL DIGITAL TRANSCEIVER AND METHOD

This is a continuation of application Ser. No. 08/552,177, filed Nov. 2, 1995 and now abandoned, which is a continuation of Ser. No. 08/366,283, filed Dec. 29, 1994, and now U.S. Pat. No. 5,579,341.

RELATED APPLICATIONS

The present application is related to commonly assigned U.S. Pat. No. 5,323,391 to R. Mark Harrison, U.S. Pat. No. 5,396,489 to R. Mark Harrison, and U.S. Pat. No. 5,406,629 to R. Mark Harrison the disclosures of which are hereby expressly incorporated herein by reference.

FIELD OF THE INVENTION

The present invention relates to communication systems, and more particularly, to multi-channel digital transmitters, receivers and transceivers for use in communication systems.

BACKGROUND OF THE INVENTION

Transmitters and receivers for communication systems generally are designed such that they are tuned to transmit and receive one of a multiplicity of signals having widely varying bandwidths and which may fall within a particular frequency range. It will be appreciated by those skilled in the art that these transmitters and receivers radiate or intercept, respectively, electromagnetic radiation within a desired frequency band. The electromagnetic radiation can be output from or input to the transmitter or receiver, respectively, by several types of devices including an antenna, a wave guide, a coaxial cable and an optical fiber.

These communication system transmitters and receivers may be capable of transmitting and receiving a multiplicity of signals; however, such transmitters and receivers generally utilize circuitry which is duplicated for each respective signal to be transmitted or received which has a different frequency or bandwidth. This circuitry duplication is not an optimal multi-channel communication unit design architecture, because of the added cost and complexity associated with building complete independent transmitters and/or receivers for each communication channel.

An alternative transmitter and receiver architecture is possible which would be capable of transmitting and receiving signals having a desired multi-channel wide bandwidth. This alternative transmitter and receiver may utilize a digitizer (e.g., an analog-to-digital converter) which operates at a sufficiently high sampling rate to ensure that the signal of the desired bandwidth can be digitized in accordance with the Nyquist criteria (e.g., digitizing at a sampling rate equal to at least twice the bandwidth to be digitized). Subsequently, the digitized signal preferably is pre- or post-processed using digital signal processing techniques to differentiate between the multiple channels within the digitized bandwidth.

With reference to FIG. 1, a prior wideband transceiver 100 is shown. Radio frequency (RF) signals are received at antenna 102 processed through RF converter 104 and digitized by analog-to-digital converter 106. The digitized signals are processed through a discrete fourier transform (DFT) 108, a channel processor 110 and from the channel processors 110 to a cellular network and a public switched telephone network (PSTN). In a transmit mode, signals received from the cellular network are processed through channel processors 110, inverse discrete fourier transform (IDFT) 114 and digital-to-analog converter 116. Analog signals from the digital-to-analog converter 116 are then up converted in RF up converter 118 and radiated from antenna 120.

A disadvantage of this alternative type of communication unit is that the digital processing portion of the communication unit must have a sufficiently high sampling rate to ensure that the Nyquist criteria is met for the maximum bandwidth of the received electromagnetic radiation which is equal to the sum of the individual communication channels which form the composite received electromagnetic radiation bandwidth. If the composite bandwidth signal is sufficiently wide, the digital processing portion of the communication unit may be very costly and may consume a considerable amount of power. Additionally, the channels produced by a DFT or IDFT filtering technique must typically be adjacent to each other.

A need exists for a transmitter and a receiver, like the one which is described above, which is capable of transmitting and receiving a multiplicity of signals within corresponding channels with the same transmitter or receiver circuitry. However, this transmitter and receiver circuitry preferably should reduce communication unit design constraints associated with the above transceiver architecture. If such a transmitter and receiver architecture could be developed, then it would be ideally suited for cellular radiotelephone communication systems. Cellular base stations typically need to transmit and receive multiple channels within a wide frequency bandwidth (e.g., 824 megahertz to 894 megahertz). In addition, commercial pressures on cellular infrastructure and subscriber equipment manufacturers are prompting these manufacturers to find ways to reduce the cost of communication units. Similarly, such a multi-channel transmitter and receiver architecture would be well suited for personal communication systems (PCS) which will have smaller service regions (than their counterpart cellular service regions) for each base station and as such a corresponding larger number of base stations will be required to cover a given geographic region. Operators which purchase base stations ideally would like to have a less complex and reduced cost unit to install throughout their licensed service regions.

An additional advantage may be gained by cellular and PCS manufacturers as the result of designing multi-channel communication units which share the same analog signal processing portion. Traditional communication units are designed to operate under a single information signal coding and channelization standard. In contrast, these multi-channel communication units include a digital signal processing portion which- may be reprogrammed, at will, through software during the manufacturing process or in the field after installation such that these multi-channel communication units may operate in accordance with any one of several information signal coding and channelization standards.

The many advantages and features of the present invention will be appreciated from the following detailed description of several preferred embodiments of the invention with reference to the attached drawings in which:

BRIEF DESCRIPTION OF THE DRAWINGS

FIG. 8 is a block diagram representation of data routing in a multi-channel transceiver in accordance with a preferred embodiment of the present invention;

FIG. 9 is a block diagram representation of data routing in a multi-channel transceiver in accordance with another preferred embodiment of the present invention;

FIG. 10 is a block diagram representation of data routing in a multi-channel transceiver in accordance with another preferred embodiment of the present invention;

FIG. 19 is a flowchart illustrating a scan procedure in accordance with a preferred embodiment of the present invention.

DETAILED DESCRIPTION OF A PREFERRED EMBODIMENT

The present invention is directed to a wideband multi-channel transmitter and receiver (transceiver) which incorporates a high degree of flexibility and redundancy and which is particularly adaptable to the cellular or PCS communication systems. The transceiver provides support for multiple antennas for either sectorized cellular operation, diversity reception, redundancy or as preferred, a combination of all of these features with enhanced user capacity at reduced cost. The transceiver of the present invention accomplishes these and many other features through a practical architecture which enhances performance through incorporation of substantial digital processing and dynamic equipment sharing (DES).

Figure 4:
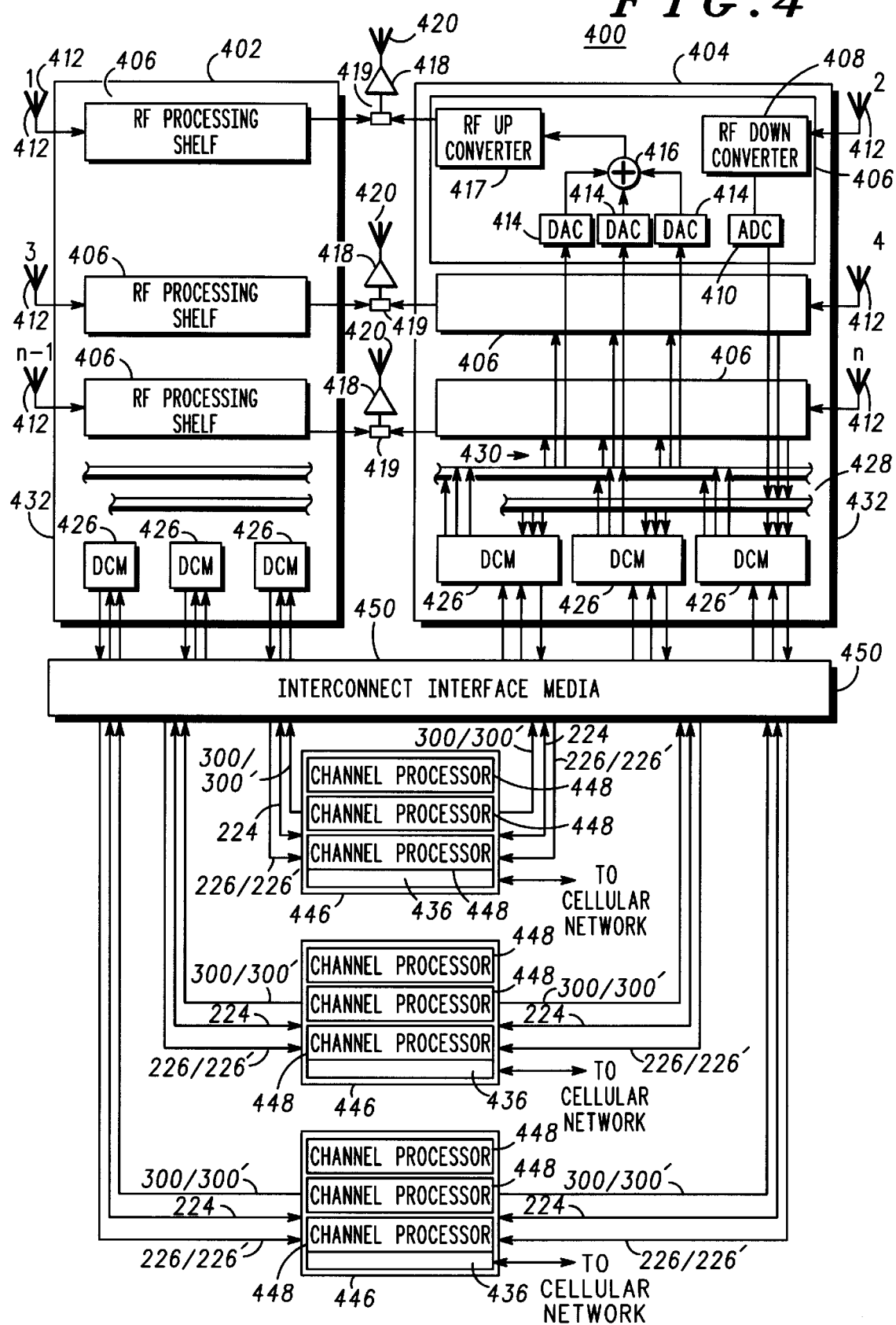
FIG. 4 is a block diagram representation of a multi-channel transceiver in accordance with a preferred embodiment of the present invention.

With reference to FIG. 4, a transceiver 400 according to a preferred embodiment of the present invention is shown. For ease of discussion, preferred embodiments of wideband multi-channel digital receiver and transmitter portions, 200 and 301, respectively, of transceiver 400 are discussed. Furthermore, to present a preferred implementation of the present invention, a transceiver operable in the cellular radio frequency (RF) band is presented. It should be understood, however, that the present invention may be easily adapted to service any RF communication band including, for example, the PCS and the like bands.

Figure 1:
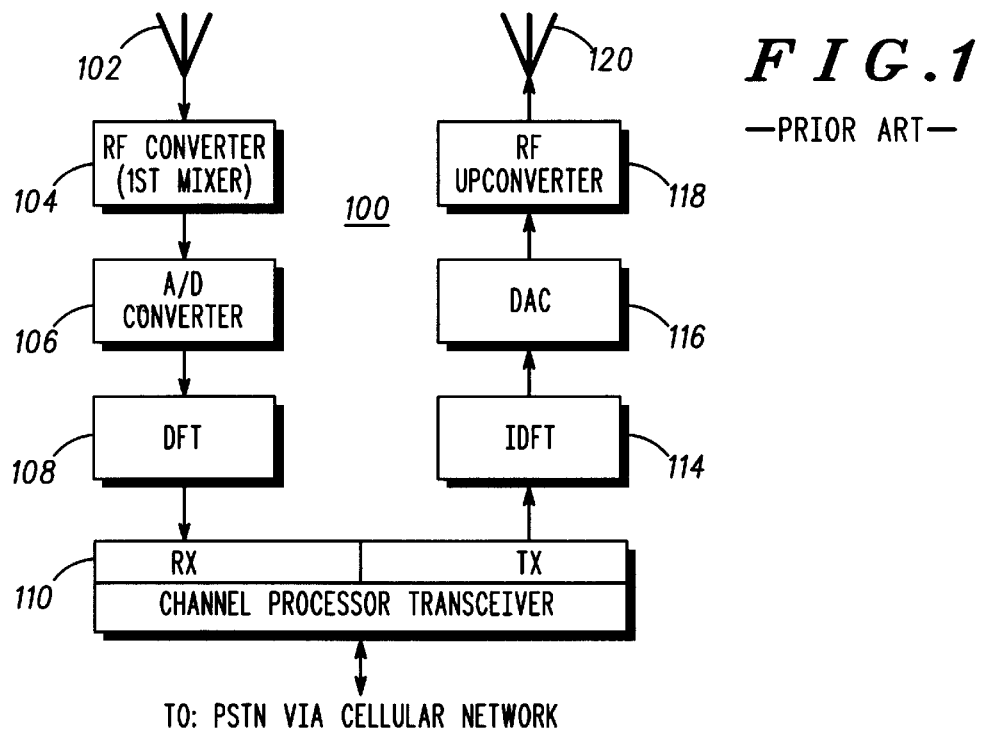
FIG. 1 is a block diagram of a prior art multi-channel transceiver.
Figure 2:
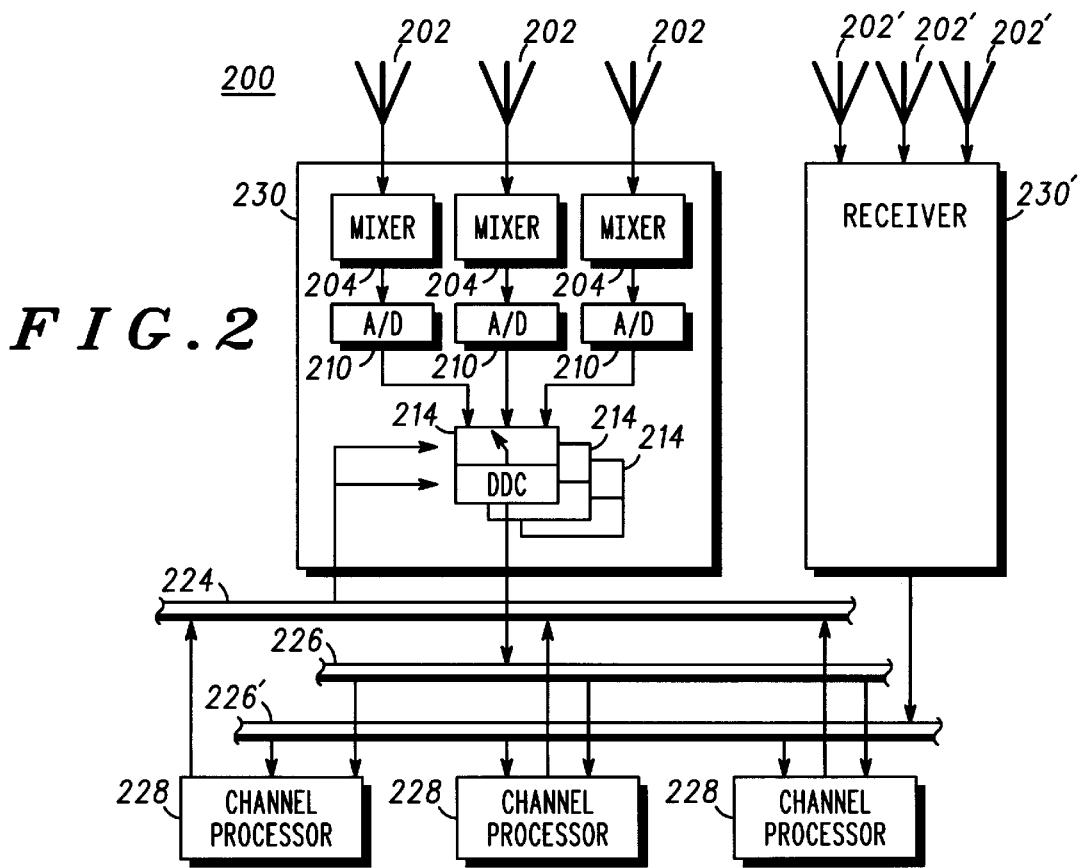
FIG. 2 is a block diagram representation of a multi-channel receiver in accordance with a preferred embodiment of the present invention.

With reference then to FIG. 2, a wideband multi-channel digital receiver portion (receiver) 200 in accordance with a preferred embodiment of the present invention is shown. The receiver 200 includes a plurality of antennas 202 (individually antennas 1,3, ..., n−1) which are coupled, respectively, to a plurality of radio-frequency mixers 204 for converting RF signals received at antennas 202 to intermediate frequency (IF) signals. It should be appreciated that the mixers 204 contain the appropriate signal processing elements at least including filters, amplifiers, and oscillators for pre-conditioning the received RF signals, isolating the particular RF band of interest and mixing the RF signals to the desired IF signals.

The IF signals are then communicated to a plurality of analog-to-digital converters (ADCs) 210 where the entire band of interest is digitized. One past disadvantage of prior wideband receivers was the requirement that the ADC, to completely and accurately digitize the entire band, operate at a very high sampling rate. For example, the cellular A and B bands occupy 25 megahertz (MHz) of RF spectrum. In accordance with the well known Nyquist criteria, to accurately digitize the entire cellular bands with a single ADC would require a device capable of operating at a sampling rate of more than 50 MHz (or 50 million samples per second, 50 Ms/s). Such devices are becoming more common and it is contemplated within the scope of the present invention to utilize the latest ADC technology. However, commonly assigned United States Patent Applications filed of even date herewith and entitled "Split Frequency Band Signal Digitizer and Method" by Smith et al. and "Wideband Frequency Signal Digitizer and Method" by Elder, the disclosures of which are hereby expressly incorporated herein by reference, disclose devices and methods for completely and accurately digitizing a wideband frequency signal using ADCs operating at lower sampling rates. The ADCs 210 digitize the IF signals thereby producing digital signals. These digital signals are then communicated to digital down converters (DDCs) 214.

Figure 11:
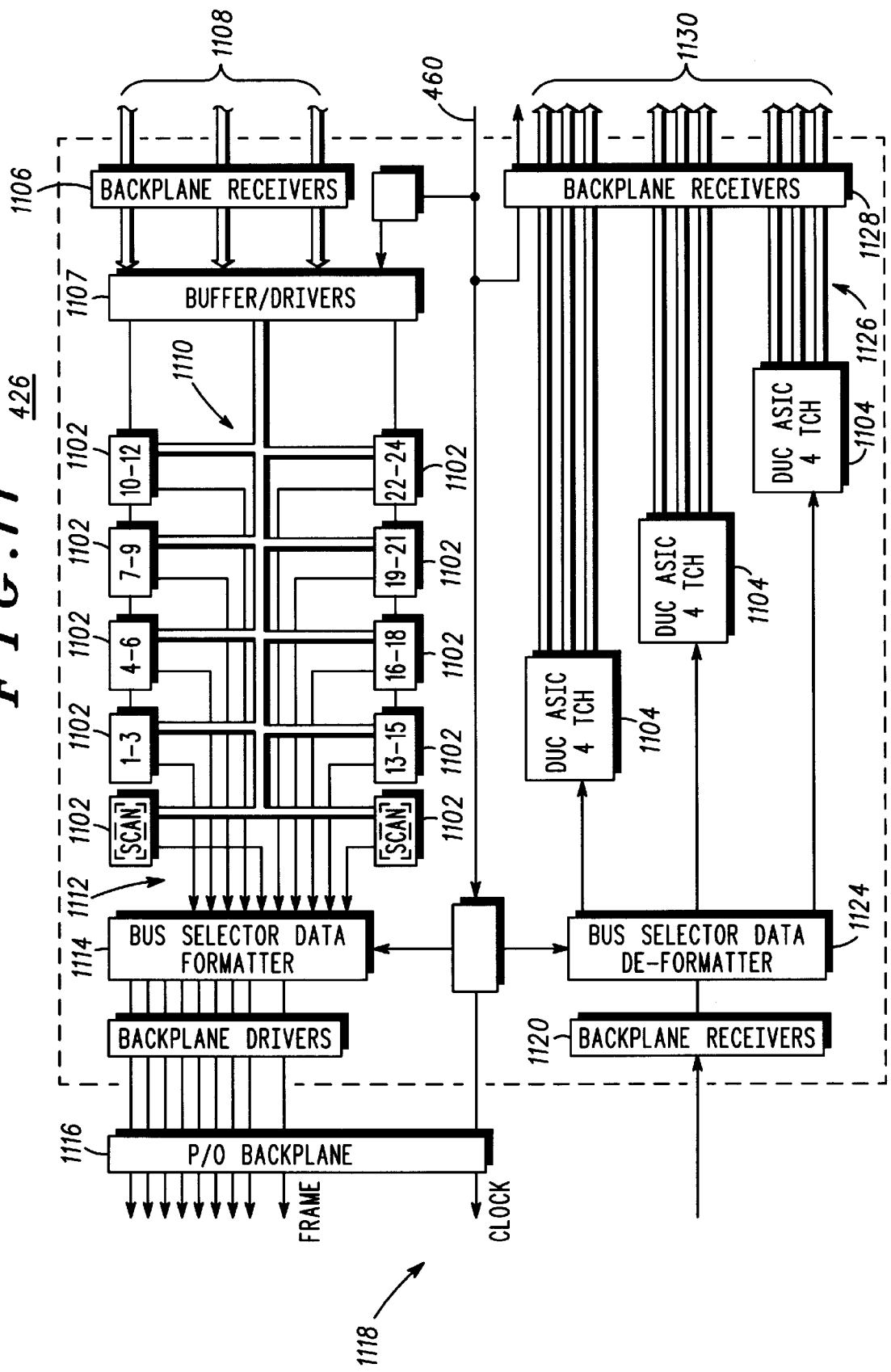
FIG. 11 is a block diagram representation of a digital converter module for the multi-channel transceiver of FIG. 4 and further in accordance with a preferred embodiment of the present invention.
Figure 12:
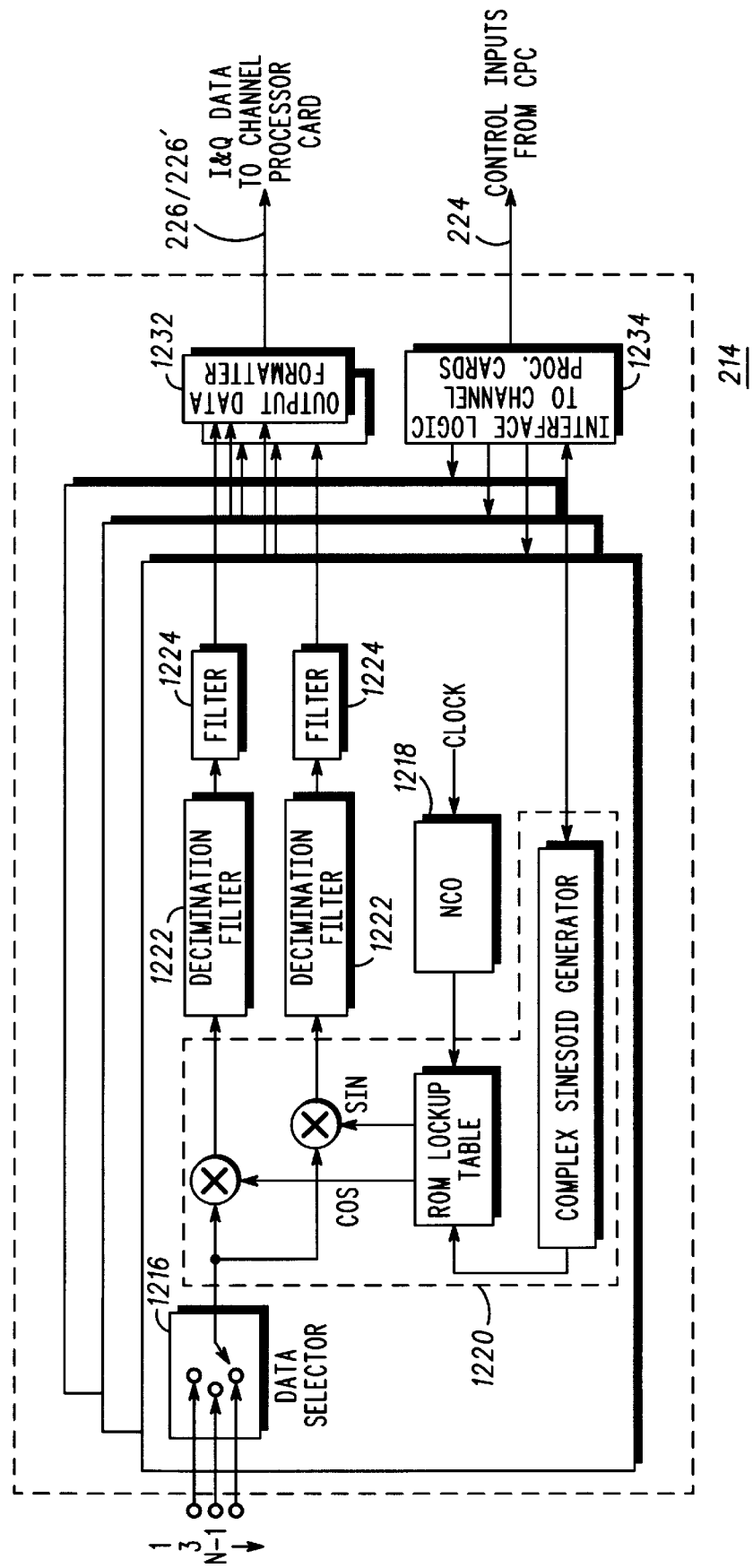
FIG. 12 is a block diagram representation of a preferred embodiment of a digital down converter in accordance with the present invention.

The DDC 214 of the preferred embodiment, seen more clearly in FIG. 12, includes a switch 1216 which allows DDC 214 to select IF signals from any one of the plurality of antennas 202. Based on the state of switch 1216, the DDC 214 accepts a high speed stream of digital words (e.g. approximately 60 MHz) from the ADC 210 associated with the selected antenna, in the preferred embodiment via a backplane interconnect 1108, FIG. 11. The DDC 214 is operable to select a particular frequency (in the digital domain), to provide decimation (rate reduction) and to filter the signal to a bandwidth associated with channels of the communication system. With particular reference to FIG. 12, each DDC 214 contains a numerically controlled oscillator (NCO) 1218 and a complex multiplier 1220 to perform a down conversion on the digital word stream. Note, this is a second down conversion since a first down conversion was performed on the received analog signal by mixers 204. The result of the down conversion and complex multiplication is a data stream in quadrature, i.e., having in-phase, I, and quadrature, Q, components, which has been spectrally translated to a center frequency of zero hertz (baseband or zero IF). The I,Q components of the data stream are communicated to a pair of decimation filters 1222, respectively to reduce the bandwidth and the data rate to a suitable rate for the particular communication system air interface (common air interface or CAI) being processed. In the preferred embodiment, the data rate output of the decimation filters is about 2.5 times the desired bandwidth of the CAI. It should be understood that the desired bandwidth may change the preferred decimation filters 1222 output rate. The decimated data stream is then low pass filtered to remove any undesirable alias components through digital filters 1224. Decimation filters 1222 and digital filters 1224 provide rough selectivity, final selectivity is accomplished within the channel processors 228 in a known manner.

Observed in FIG. 2, a plurality of DDCs 214 are provided in the preferred embodiment and each are interconnected to ADCs 210. Each of the DDCs 214 can select one of the plurality of ADCs 210/antennas 202 from which to receive a high speed digital word stream via backplane 1106. The outputs of the DDCs 214, a low speed data stream (e.g. approximately 10 MHz, baseband signal), are connected to a time domain multiplex (TDM) bus 226 for communication to a plurality of channel processors 228 via output formatter 1232. By placing the outputs of the DDCs on TDM bus 226, it is possible to have any one of the channel processors 228 select any one of the DDCs 214 for receiving a baseband signal. In the event of a failure of a channel processor 228 or a DDC 214, the channel processors 228 would be operable, via the control bus 224 and control bus interface 1234, to interconnect available channel processors to available DDCs with appropriate contention/arbitration processing to prevent two channel processors from attempting to access the same DDC. In the preferred embodiment, however, the DDCs 214 are allocated a dedicated time slot on TDM bus 226 for interconnection to a particular channel processor 228.

The channel processors 228 are operable to send control signals via the control bus 224 to the DDCs 214 for setting digital word stream processing parameters. That is, the channel processors 228 can instruct the DDCs 214 to select a down conversion frequency, a decimation rate and filter characteristics (e.g., bandwidth shape, etc.) for processing the digital data streams. It is understood that the NCO 1218, complex multiplier 1220, decimator 1222 and digital filter 1224 are responsive to numerical control to modify the signal processing parameters. This allows receiver 200 to receive communication signals conforming to a number of different air interface standards.

With continued reference to FIG. 2, the receiver of the present invention further provides a plurality of receiver banks (two shown and illustrated as 230 and 230'). Each of the receiver banks 230 and 230' include the elements described above prior to TDM bus 226 for receiving and processing a radio frequency signal. In order to provide diversity reception with the present invention, a pair of adjacent antennas, one from antennas 202 and one from antennas 202' (individually referenced as 2,4, . . . , n), each associated with receiver banks 230 and 230', respectively, are designated to service a sector of the communication system. The signals received at each antenna 202 and 202' are processed independently through receiver banks 230 and 230', respectively. The outputs of the receiver banks 230 and 230' are communicated respectively on TDM buses 226 and 226', although it is understood that a single bus may be used, to the channel processors 228, wherein the diversity reception is accomplished.

Figure 17:
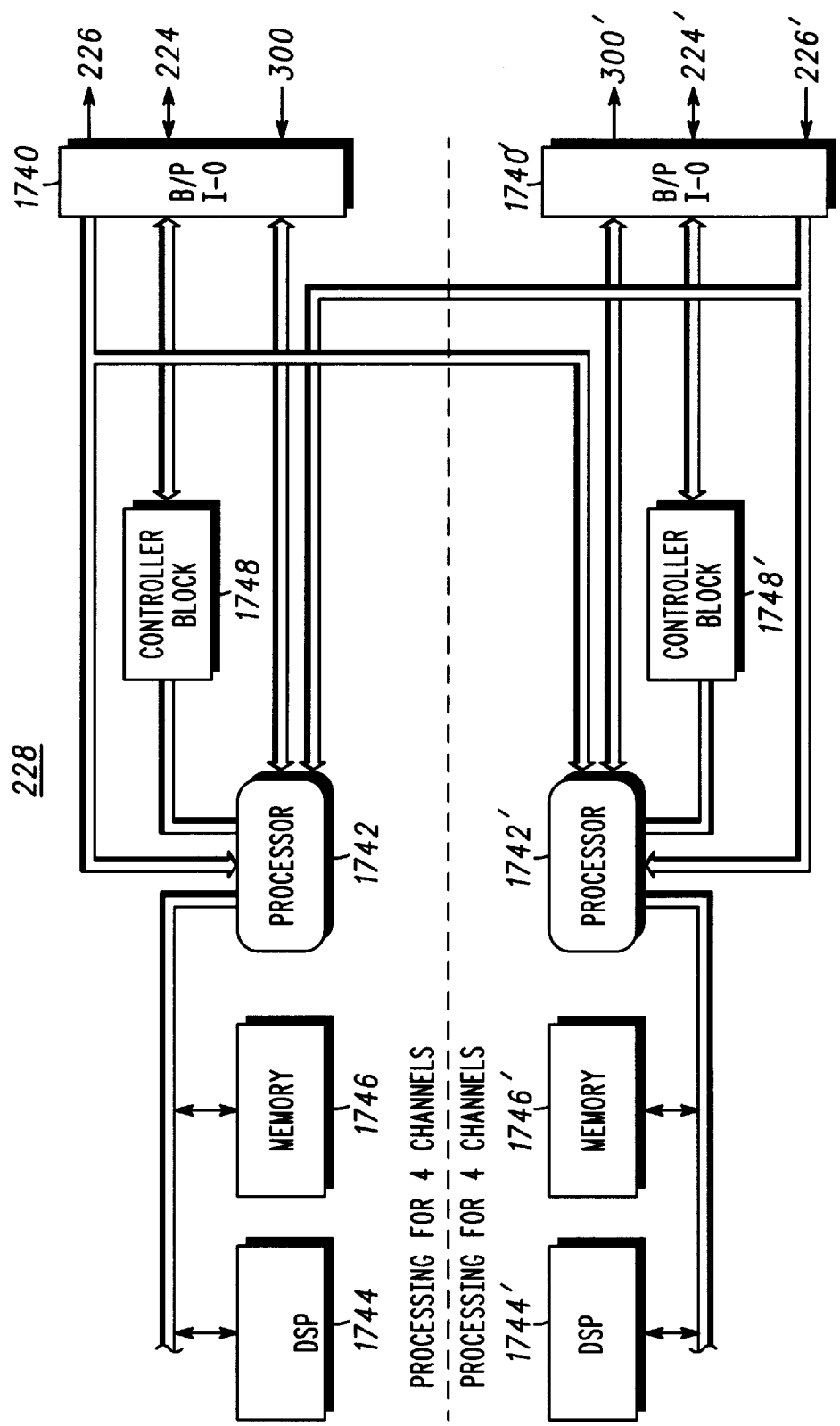
FIG. 17 is a block diagram representation of a preferred embodiment of a channel processor card in accordance with the present invention.

The channel processors 228 receive the baseband signals and perform the required baseband signal processing, selectivity to recover communication channels. This processing at least includes audio filtering in analog CAI communication systems, forward error correction in digital CAI communication systems, and receive signal strength indication (RSSI) in all communication systems. Each channel processor 228 recovers traffic channels independently. Furthermore, to provide diversity, each channel processor 228 is operable to listen to each of the pair of antennas assigned to a sector and to thereby receive and process two baseband signals, one per antenna. The channel processors 228 are further provided an interface 436, FIG. 4, to the communication network, for example in a cellular communication system to a base station controller or mobile switching center, via a suitable interconnect With reference to FIG. 17 a preferred embodiment of a channel processor 228 is shown. As will be described, each of the channel processors is operable for both transmit and receive operations. In the preferred embodiment, each channel processor 228 is capable of servicing up to 8 communication channels of the communication system in both transmit and receive (4 channels in receive mode with diversity). The low speed baseband signal from TDM buses 226 or 226' are received respectively at input/output (I/O) ports 1740 and 1740' and are communicated to a pair of processors 1742 and 1742'. Associated with each processor 1742 and 1742', are digital signal processors (DSPs) 1744 and 1744' and memory 1746 and 1746'. Each processor 1742 and 1742' is operable to service four (4) communication channels. As can be seen in FIG. 17, in a preferred embodiment, the processors 1742 and 1742' are configured to listen to either one, or both as is required in the preferred diversity arrangement, of the receiver banks 230 or 230'. This structure, while also enabling diversity, provides redundancy. In the receive mode if one of the processors 1742 or 1742' fails, only diversity is lost as the other processor 1742 or 1742' is still available to process the uplink baseband signals from the other receiver bank. It should be appreciated that processors 1742 and 1742' can be implemented with appropriate diversity selection or diversity combining processing capability. Processors 1742 and 1742' are further in communication with control elements 1748 and 1748', respectively, for processing and communicating control information to the DDCs 214 via I/O ports 1740 and 1740' and the control bus 224 as described.

Figure 3:
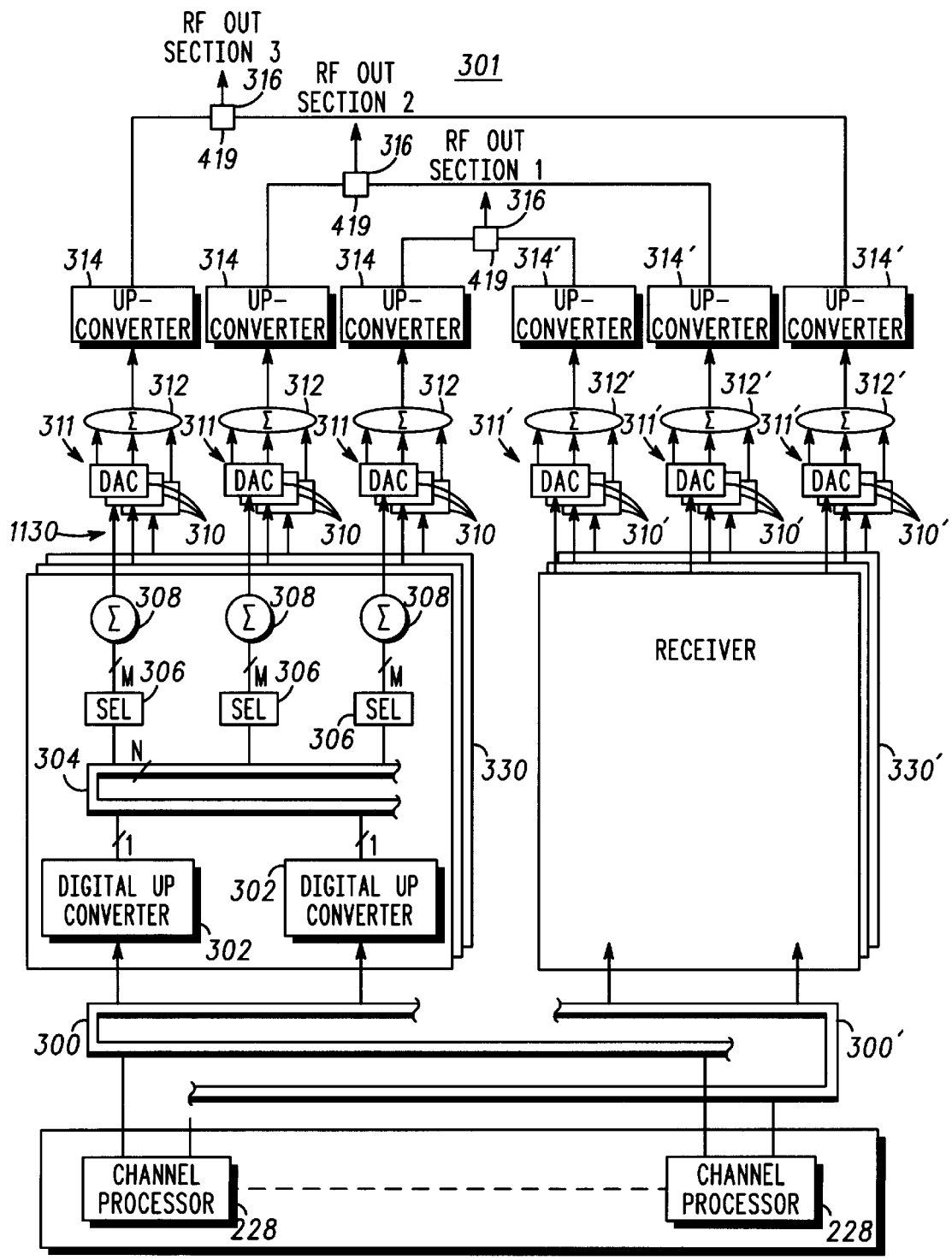
FIG. 3 is a block diagram representation of a multi-channel transmitter in accordance with preferred embodiment of the present invention.

With continued reference to FIG. 17 and reference to FIG. 3, the transmitter portion 301 (transmitter) of transceiver 400 will be described. In a transmit mode, the channel processors 228 receive downlink communication signals from the communication system network (via interface 436 not shown in FIG. 17) for communication over a communication channel. These downlink signals can be, for example, control or signaling information intended for the entire cell (e.g., a page message) or a particular sector of a cell (e.g., a handoff command) or downlink voice and/or data (e.g., a traffic channel). Within channel processors 228, processors 1742 and 1742' independently operate on the downlink signals to generate low speed baseband signals. In transmit mode, the channel processors 228 are capable of servicing eight (8) communication channels (either traffic channels, signaling channels or a combination thereof). If one of the processors 1742 or 1742' fails, the effect on the system is a loss of capacity, but not a loss of an entire sector or cell. Moreover, removing one of the plurality of channel processors 228 from the communication system results in the loss of only eight channels.

The processing of the baseband signals through the transmitter 301 is complementary to the processing completed in the receiver 200. The low speed baseband signals are communicated from the channel processors 228 via I/O ports 1740 or 1740' to TDM downlink busses 300 and 300', although a single bus may be used, and from there to a plurality of digital up converters (DUCs) 302. The DUCs 302 interpolate the baseband signals to a suitable data rate. The interpolation is required so that all baseband signals from the channel processors 228 are at the same rate allowing for summing the baseband signals at a central location. The interpolated baseband signals are then up converted to an appropriate IF signal such as quadrature phase shift keying (QPSK) differential quadrature phase shift keying (DQPSK), frequency modulation (FM) or amplitude modulation (AM) signals (with I,Q input, the modulation is accomplished within the channel processors 228). The baseband signals are now carrier modulated high speed baseband data signals offset from zero hertz. The amount of offset is controlled by the programming of the DUCs 302. The modulated baseband signals are communicated on a high speed backplane interconnect 304 to signal selectors 306. The signal selectors are operable to select sub-groups of the modulated baseband signals. The selected sub-groups are communication channels which are to be transmitted within a particular sector of the communication system. The selected sub-group of modulated baseband signals are then communicated to digital summers 308 and summed. The summed signals, still at high speed, are then communicated, via backplane interconnect 1130 to digital-to-analog converters (DACs) 310 and are converted to IF analog signals. These IF analog signals are then up converted by up converters 314 to RF signals, amplified by amplifiers 418 (FIG. 4) and radiated from antennas 420 (FIG. 4).

In the preferred embodiment, to once again provide enhanced system reliability, a plurality of DACs 310 are provided with groups 311 of three DACs being arranged on RF shelves, one DAC associated with a shelf. The groups of DACs 311 convert three summed signals, received on separate signal busses 313 of backplane interconnect 1130, to analog signals. This provides for increased dynamic range over what could be achieved with a single DAC. This arrangement further provides redundancy since if any of the DACs fail, there are others available. The result is merely a decrease in system capacity and not a loss of an entire sector or cell. The outputs of a group of DACs 311 receiving signals for a sector of the communication system are then analog summed in summers 312, with the summed analog signal being communicated to up converters 314.

Similar to the receiver 200, the transmitter 301 is also arranged with a plurality of transmitter banks (two shown as 330 and 330'). The transmitter banks 330 and 330' include all of the equipment for the transmitter 301 between the channel processors 228 and the amplifiers 418. The output of the up converters 314, up converting summed analog signals for a sector of the communication system, for each transmitter bank 330 and 330' are then summed in RF summers 316. The summed RF signals are then communicated to amplifiers 418 and radiated on antennas 420. If an entire transmitter bank 330 or 330' fails, the effect is still only a loss of system capacity and not a loss of an entire portion of the communication system.

Figure 13:
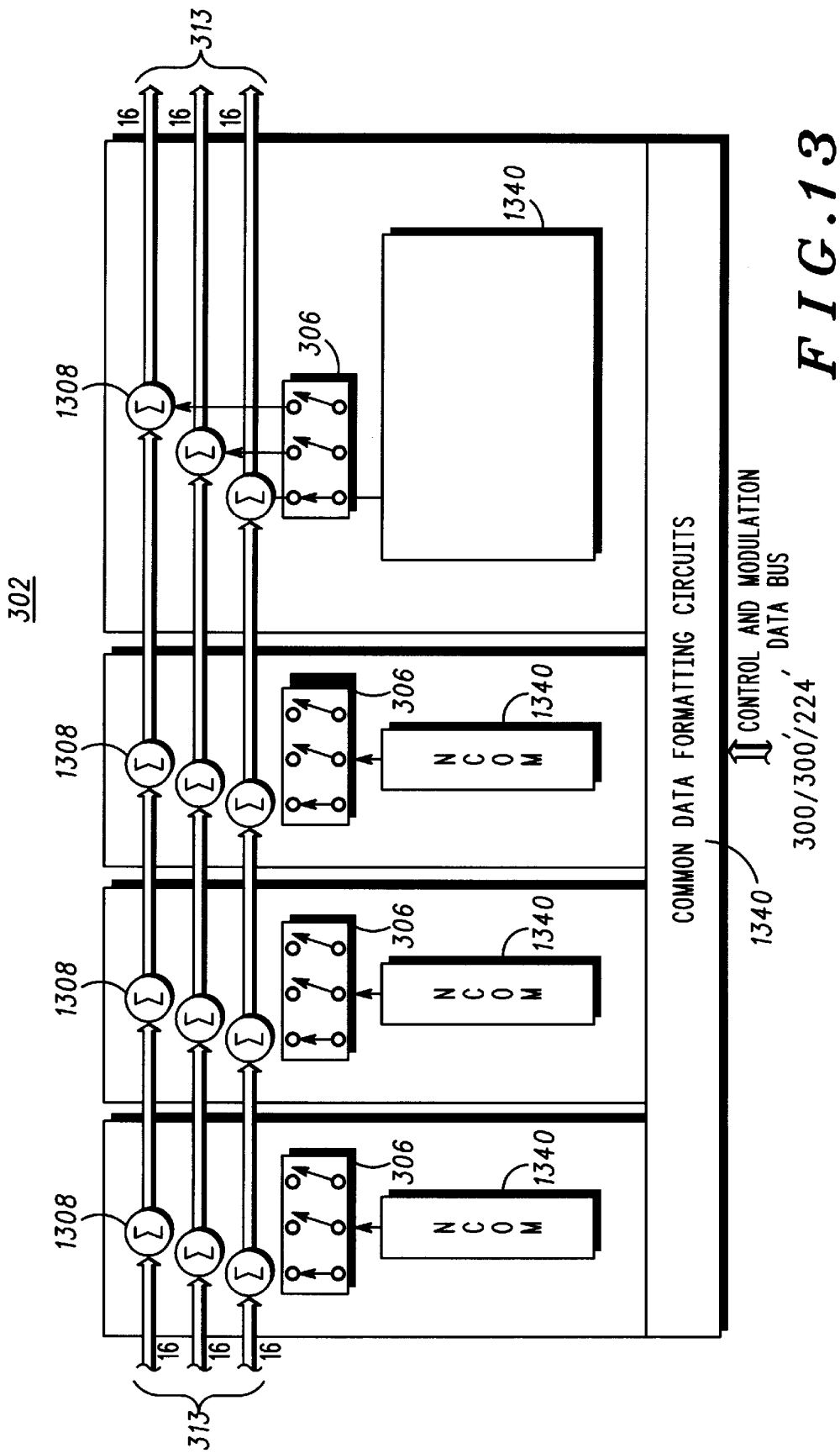
FIG. 13 is a block diagram representation of a preferred embodiment of a digital up converter in accordance with the present invention.

With reference to FIG. 13 a transmitter 330' in accordance with a preferred embodiment of the present invention is shown. Transmitter 330' represents a second embodiment used for the transmitter design of FIG. 3. In the preferred embodiment, there is provided a plurality of transmitter 330' each of which includes an up converter/modulator 1340 which receives downlink baseband signals from busses 300 and 300' and control signals from control bus 224 via formater circuits 1341. The output of the up converter/modulator 1340 is then communicated to selector 306. In the preferred embodiment, selector 306 can take the form of banks of dual-input AND gates, one input of which is connected to one bit of the data word (i.e. the modulated baseband signal). With the control line held high (logical 1), the outputs will follow the transitions of the inputs. The output of selector 306 is then communicated to a digital summer bank 1308, which adds data from previous digital summers associated with other transmitters 330' onto one of a plurality of signal paths 313. Each signal path, as indicated, is associated with a sector of the communication system and communicates the summed signals to either another transmitter 330' or to DAC groups 311. If selector 306 is open, the output of selector 306 is zeros, and as an input to summer 1308 leaves the incoming signal unchanged. It should also be understood that scaling may be required on the input, the output or both of summers 1308 for scaling the summed digital signal within the dynamic range of the summers 1308. In this manner, the outputs of the transmitters, representing signals destined for particular sectors of the communication system can be summed into a single signal for conversion to an analog signal. Or, as is accomplished in the preferred embodiment, may be further collected in sets and converted to analog signals by multiple DACs for enhancing the dynamic range and providing redundancy.

Figure 14:
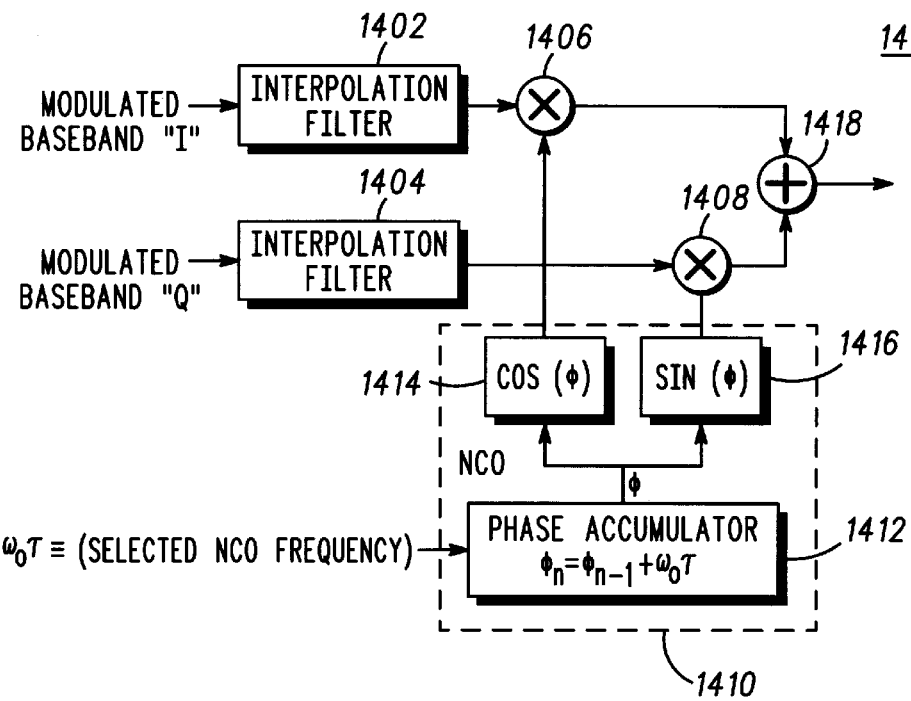
FIG. 14 is a block diagram representation of an up converter adaptable to the digital up converter of the present invention.

With reference to FIG. 14, an up converter 1400 for I,Q modulation in accordance with the present invention is shown. The up converter 1400 includes first and second interpolation filters 1402 and 1404 (e.g., finite impulse response (FIR) filters) for interpolating the I,Q portions of the baseband signal, respectively. The interpolated I,Q portions of the baseband signal are up converted in mixers 1406 and 1408, receiving input from numerically controlled oscillator 1410. Numerically controlled oscillator (NCO) 1410 receives as an input the product of the up conversion frequency, $\omega_o$, and the inverse sample rate, $\tau$, which is a fixed phase increment dependent on the up conversion frequency. This product is supplied to a phase accumulator 1412 within NCO 1410. The output of phase accumulator 1412 is a sample phase, $\Phi$, which is communicated to sine and cosine generators 1414 and 1416, respectively, for generating the up conversion signals. The up converted I,Q portions of the baseband signal are then summed in summer 1418 providing the modulated IF signal output of up converter 1400.

Figure 15:
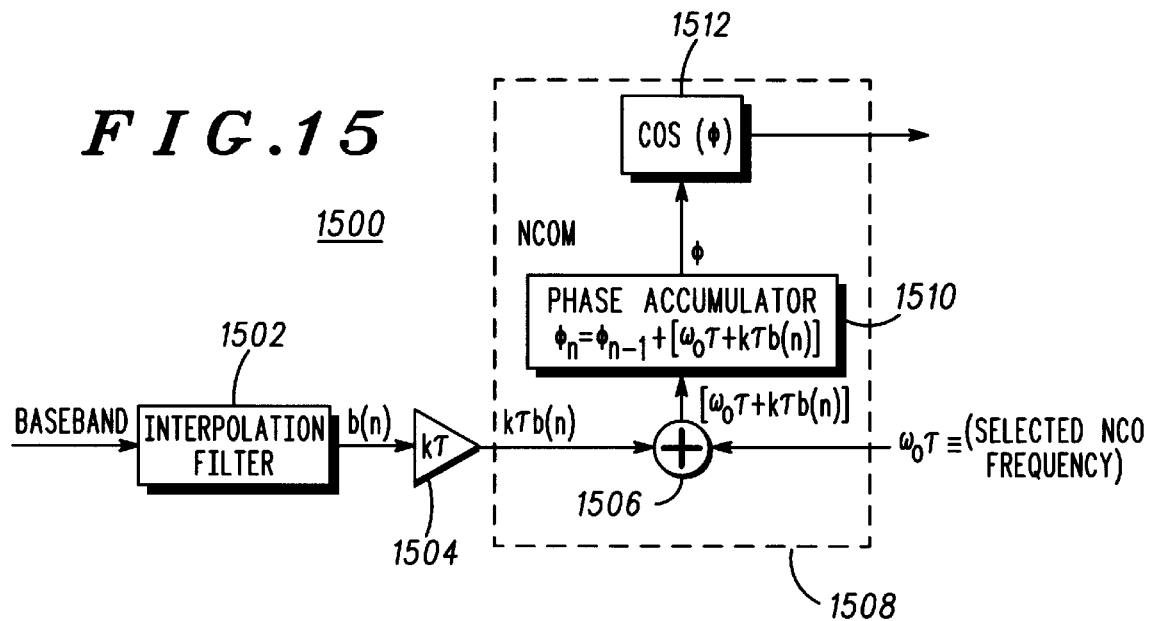
FIG. 15 is a block diagram representation of a modulator adaptable to the digital up converter of the present invention.

In FIG. 15, a modulator 1500 for R,$\Theta$ modulation, direct modulation of the phase, is shown. Modulator 1500 provides a simplified way of generating FM over up converter 1400. The baseband signal is communicated to interpolation filter 1502 (e.g., and FIR filter) which is then scaled by $k\tau$ in scaler 1504. The interpolated and scaled baseband signal is then summed in summer 1506 with the fixed phase increment $\omega_o\tau$ in a numerically controlled oscillator/modulator (NCOM) 1508. This sum is then communicated to a phase accumulator 1510 which outputs a sample phase, $\Phi$, which in turn is communicated to a sinusoid generator 1512 for generating the modulated IF signal output of modulator 1500.

Figure 16:
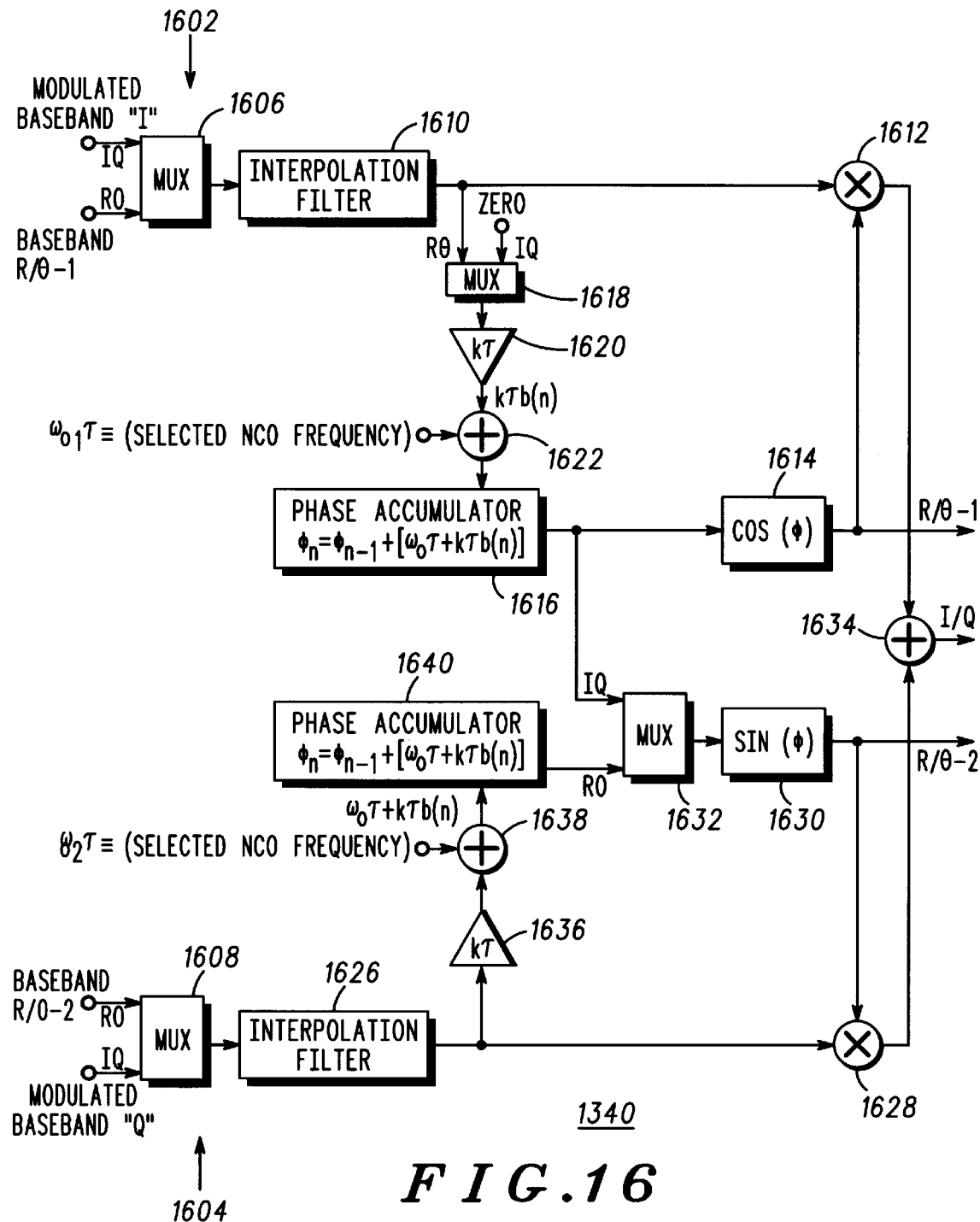
FIG. 16 is a block diagram representation of a preferred embodiment up converter/modulator for the digital up converter of the present invention.

The devices shown in FIGS. 14 and 15 are suitable for use in up converter/modulator 1340 of the present invention. However, the up converter 1400 is not efficient with respect to generating FM, while modulator 1500 does not provide I,Q up conversion. In FIG. 16, a preferred up converter/modulator 1340 is shown which provides both I,Q up conversion and FM modulation. Interpolator/modulator 1340 provides I,Q up conversion for a single baseband signal or R,Θ modulation for two baseband signals.

The I,Q portions of the baseband signal or two R,Θ signals are input to up converter/modulator 1340 at ports 1602 and 1604, respectively. Signal selectors 1606 and 1608 are provided and select between the I,Q or R,Θ signals based upon the mode of operation of up converter/modulator 1340.

With respect to processing of an I,Q signal, the I portion of the signal is communicated from selector 1606 to interpolation filter, (e.g., an FIR filter) 1610. The interpolated I signal is then communicated to mixer 1612 where it is up converted by a sinusoid from cosine generator 1614. Cosine generator 1614 receives an input sample phase Φ from phase accumulator 1616. A selector 1618 is provided and selects a zero input for I,Q up conversion. The output of selector 1618 is scaled by $k\tau$ in scaler 1620 yielding a zero output which is added to $\omega_o\tau$ in adder 1622. This sum, which is $\omega_o\tau$ in the I,Q up conversion case, is input to phase accumulator 1616 to produce the sample phase output, Φ.

Processing of the Q portion of the signal is similar. The Q signal is selected by selector 1608 and communicated to interpolation filter (e.g., an FIR filter) 1626. The interpolated Q signal is then communicated to mixer 1628 where it is up converted by a sinusoid from sine generator 1630. Sine generator 1630 receives an input from selector 1632 which selects the sample phase, Φ, generated by phase accumulator 1616 in the I,Q case. The up converted I,Q signals are then summed in summer 1634 as the up converted/modulated output of up converter/modulator 1340 in the I,Q mode.

In R,Θ processing, the selectors 1606 and 1608 select two separate R,Θ signals. For R,Θ processing, up converter/modulator 340 is operable to process two R,Θ signals simultaneously. The first signal, R,Θ-1 is interpolated and filtered in interpolation filter 1610. In the R,Θ case, selector 1618 selects the interpolated R,Θ-1 signal which is scaled by $k\tau$ in scaler 1620 and added to $\omega_o\tau$ in adder 1622. The output of adder 1622 is then communicated to phase accumulator 1616 which produces a sample phase, Φ which is input to cosine generator 1614. The output of cosine generator 1614 is one of two modulated IF signal outputs of up converter/modulator 1340 in R,Θ processing mode.

The second R,Θ signal, R,Θ-2, is selected by selector 1608 and is communicated to interpolation filter 1626. The interpolated R,Θ-2 signal is then communicated to scaler 1636 where it is scaled by $k\tau$. The scaled signal is then summed with $\omega_o\tau$ in adder 1638. The output of adder 1638 is input to phase accumulator 1640 which produces an output sample phase, Φ which is selected by selector 1632 and communicated to sine generator 1630. The output of sine generator 1630 is the second of two modulated IF signal outputs of up converter/modulator 1340 in R,Θ processing mode.

Having now described separately the receiver 200 and transmitter 301 portions of transceiver 400, transceiver 400 will be described in more detail with reference to FIG. 4. Transceiver 400 is structured in a pair of transceiver banks 402 and 404. Each bank is identical and includes a plurality of RF processing shelves 406. Each RF processing shelf 406 houses a RF mixer 408 and an ADC 410 which are coupled to receive and digitize a signal from antenna 412. RF processing shelf 406 further includes three DACs 414, the outputs of which are summed by summer 416 and communicated to RF up converter 418. The output of RF up converter 417 is further communicated to an RF summer 419 for summing with a corresponding output from transceiver bank 404. The summed RF signal is then communicated to amplifier 418 where it is amplified before being radiated from antenna 420.

Received signals from ADC 410 are interconnected to a plurality of digital converter modules (DCMs) 426 via receive busses 428. Similarly, transmit signals are communicated from DCMs 426 to DACs 414 via transmit busses 430. As will be appreciated, receive busses 428 and transmit busses 430 are high speed data buses implemented into a backplane architecture within the RF frame 432. In the preferred embodiment, communication over the backplane is at approximately 60 MHz, however, the close physical relationship of the elements allows for such high speed communication without significant errors in the high speed data signal.

With reference to FIG. 11 a preferred embodiment of a DCM 426 is illustrated. DCM 426 includes a plurality of DDC application specific integrated circuits (ASICs) 1102 and a plurality of DUC ASICs 1104 for providing receive and transmit signal processing. Receive signals are communicated from antennas 412 via a receive backplane interconnect 1108, backplane receiver 1106 and buffer/driver bank 1107 to DDC ASICs 1102 over communication links 1110. In the preferred embodiment, DCM 426 includes ten DDC ASICs 1102 each DDC ASIC 1102 having implemented therein three individual DDCs, as described above. In the preferred embodiment, eight of the DDC ASICs 1102 provide communication channel functions while two of the DDC ASICs 1102 provide scanning functions. The outputs of DDC ASICs 1102 are communicated via links 1112 and backplane formater 1114 and backplane drivers 1116 to the backplane interconnect 1118. From backplane interconnect 1118, receive signals are communicated to an interface media 450 (FIG. 4) for communication to a plurality of channel processors 448 arranged in groups in processor shelves 446.

In transmit mode, transmit signals are communicated from channel processors 448 over the interface media 450 and backplane interconnect 1118 to the transmit backplane receivers 1120 to a plurality of DUC ASICs 1104 via selector/formater 1124. Each of the DUC ASICs 1104 contain four individual DUCs, the DUCs as described above, for processing four communication channels in R,Θ mode or two communication channels in I,Q mode. The outputs of DUC ASICs 1104 are communicated via links 1126 to transmit backplane drivers 1128 and backplane interconnect 1130 for communication to the DACs 414.

It should be understood that suitable provision is made for providing clock signals to the elements of DCM 426 as generally indicated as 460.

With respect to the interface media 450 between the DCMs 426 and the channel processors 448, this may be any suitable communication media. For example, interface media may be a microwave link, TDM span or fiber optic link. Such an arrangement would allow for channel processors 448 to be substantially remotely located with respect to the DCMs 426 and the RF processing shelves 406. Hence, the channel processing functions could be accomplished centrally, while the transceiver functions are accomplished at a communication cell site. This arrangement simplifies construction of communication cell sites as a substantial portion of the communication equipment can be remotely located from the actual communication cell site.

As shown in FIG. 4, transceiver 400 includes three DCMs 426, with a capability of twelve communication channels per DCM 426. This arrangement provides system reliability. Should a DCM 426 fail, the system loses only a portion of the available communication channels. Moreover, DCMs may be modified to provide multiple air interface capability. That is the DDCs and DUCs on the DCMs may be individually programmed for particular air interfaces. Hence, transceiver 400 provides multiple air interface capability.

Figure 5:
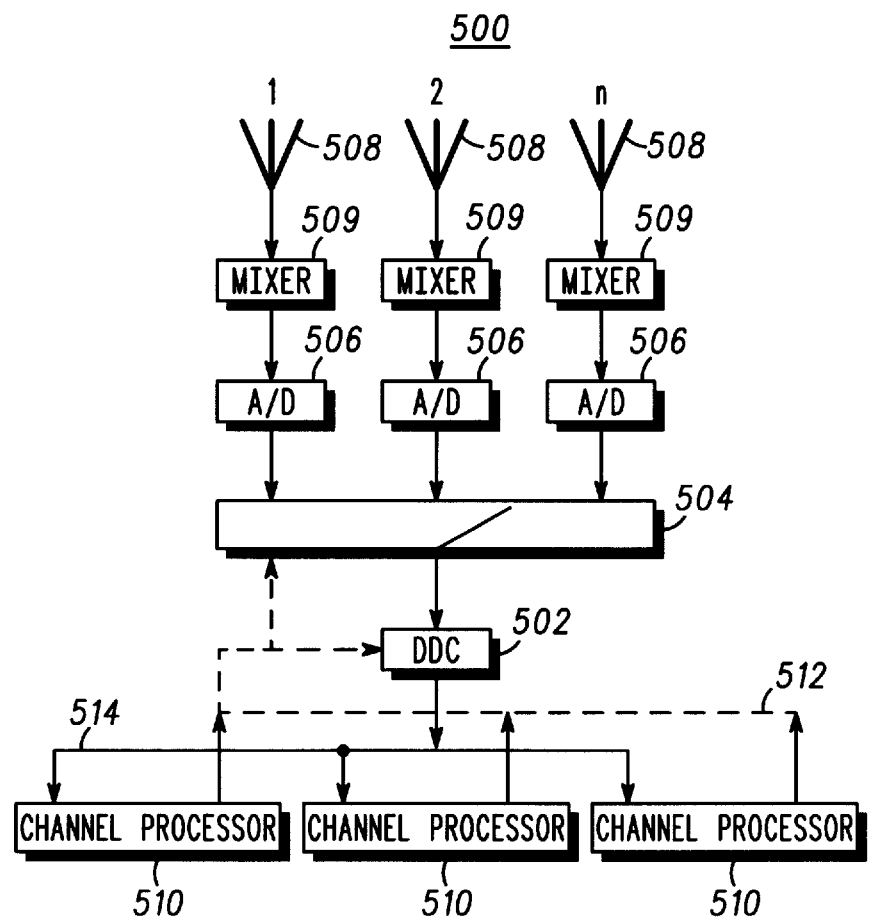
FIG. 5 is a block diagram representation of the multi-channel receiver shown in FIG. 2 and modified to provide per-channel scanning in accordance with another preferred embodiment of the present invention.

As appreciated from the foregoing, there are numerous advantages to the structure of transceiver 400. With reference to FIG. 5 a receiver 500 of transceiver 400 is shown which is very similar to the receiver 200 shown in FIG. 2. The plurality of DDCs 214 and the interconnecting TDM bus 226 have been removed for clarity only, and it should be understood that receiver 500 includes these elements. Receiver 500 includes an additional DDC 502 interconnected as before via a selector 504 to ADCs 506 for receiving uplink digital signals from antennas 508/mixers 509 and for communicating data signals to channel processors 510 via data bus 514. During operation, it may be necessary for a channel processor 510 to survey other antennas, antennas other than an antenna it is presently processing a communication channel for, to determine if it is communicating over the best antenna in the communication cell. That is, if an antenna servicing another sector of the communication cell provides better communication quality, the communication link should be reestablished on that antenna. To determine the availability of such antennas providing better communication quality, the channel processor scans each sector of the communication cell. In the present invention, this is accomplished by having the channel processor 510 seize DDC 502 and program it, via the control bus 512, to receive communications from each of the antennas in the communication cell. The information received, for example received signal strength indications (RSSI) and the like, are evaluated by channel processors 510 to determine if a better antenna exists. The processing in DDC 502 is identical to the processing accomplished in DDCs 214, with the exception that DDC 502, under instruction of channel processor 510, receives signals from a plurality of the antennas in the communication cell as opposed to a single antenna servicing an active communication channel.

FIG. 19 illustrates a method 1900–1926 of accomplishing this per-channel scanning feature. The method enters at bubble 1900 and proceeds to block 1902 where a timer is set. The channel processor then checks if DDC 302 is idle, 1904, i.e., not presently performing a scan for another channel processor, and if it is idle, checks to see if the control bus 312 is also idle, 1906. If it is, the timer is stopped, 1908 and channel processor 310 seizes the control bus 312, 1909. If channel processor 310 is unable to seize the control bus 312, 1912, then the method loops back to block 1902. If either the DDC 302 or the control bus 312 are not idle, then a time out check is made, 1910, if time out has not been reached, the method loops back to check if the DDC has become available. If a time out has been reached, an error is reported, 1920, i.e., channel processor 310 was unable to complete a desired scan.

If the control bus 312 is successfully seized, 1912, channel processor programs DDC 302 for the scan function, 1914. If, however, DDC 302 has become active 1916, the programming is aborted and an error is reported, 1920. Otherwise, the DDC 302 accepts the programming and begins collecting samples, 1918, from the various antennas 308. When all the samples are collected, 1922, the DDC is programmed to an idle state, 1924, and the method ends 1926.

Another feature of transceiver 400 is an ability to provide signaling to particular sectors or to all sectors of a communication cell. With reference once again to FIGS. 3 and 13, the outputs of up converter/modulators 1340 are communicated to selectors 306 which are operable to select outputs from the plurality of up converter/modulators 1340 which are to be directed to a particular sector of the communication cell. As illustrated in FIG. 3, for a three sector communication cell, three data paths 313 are provided corresponding to the three sectors of the communication cell, and the function of selectors 306 is to sum the output of up converters/modulators 1340 onto one of these three data paths. In this manner, the downlink signals from up converters/modulators 1340 are communicated to an appropriate sector of the communication cell.

Selector 306, however, is further operable to apply the output of an up converter/modulator 1340 to all of the signal paths 313. In this case, the downlink signals from the up converter/modulator 1340 is communicated to all sectors of the communication cell simultaneously. Hence, an omni like signaling channel, through simulcast, is created by designating an up converter/modulator as a signaling channel and programming selector 306 to communicate the downlink signals from this up converter/modulator to all sectors of the communication cell. Moreover, it should be appreciated that signaling to particular sectors may be accomplished by reprogramming selector 306 to communicate the downlink signals from a signaling up converter/modulator 1340 to one or more sectors of the communication cell.

Figure 6:
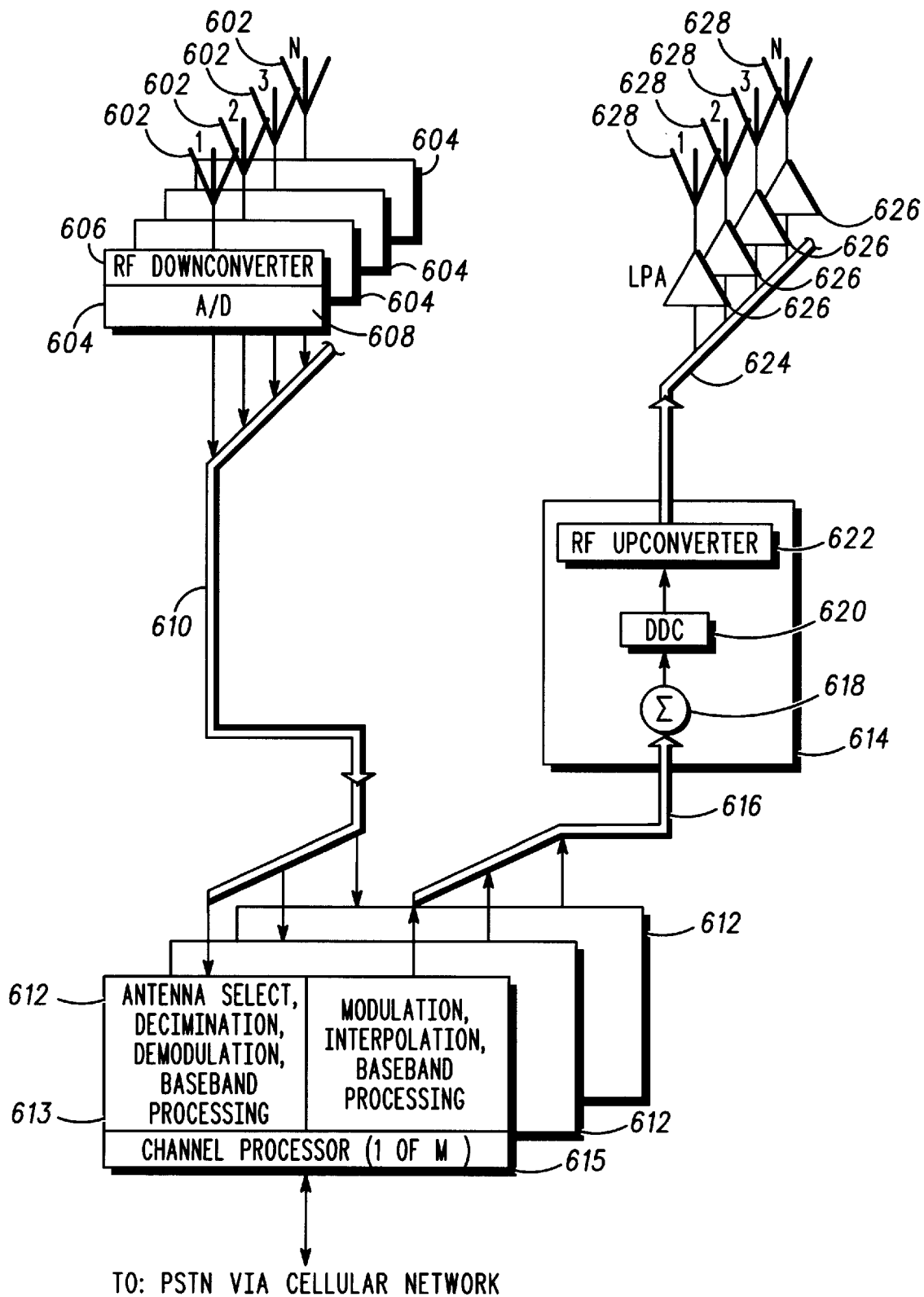
FIG. 6 is a block diagram representation of a multi-channel transceiver in accordance with another preferred embodiment of the present invention.

With reference to FIG. 6, a transceiver 600 is shown which, while containing the functional elements described with respect to transceiver 400, provides a different architectural arrangement. Transceiver 600 advantageously provides uplink digital down conversion and corresponding downlink digital up conversion within the channel processors. The channel processors are then interconnected to the RF hardware via a high speed link.

In a receive mode, RF signals are received at antennas 602 (individually number 1, 2, . . . , n) and are communicated to associated receive RF processing shelves 604. Each receive RF shelf 604 contains an RF down converter 606 and an analog to digital converter 608. The outputs of the receive RF shelves 604 are high speed digital data streams which are communicated via an uplink bus 610 to a plurality of channel processors 612. The uplink bus 610 is a suitable high speed bus, such as a fiber optic bus or the like. The channel processors 612 include a selector for selecting one of the antennas from which to receive a data stream and a DDC and other baseband processing components 613 for selecting and processing a data stream from one of the antennas to recover a communication channel. The communication channel is then communicated via a suitable interconnect to the cellular network and PSTN.

In a transmit mode, downlink signals are received by the channel processors 612 from the cellular network and PSTN. The channel processors include up converter/modulators 615 for up converting and modulating the downlink signals prior to communicating a downlink data stream to transmit RF processing shelves 614 over transmit bus 616. In should be understood that transmit bus 616 is also a suitable high speed bus. Transmit RF processing shelves 614 include the digital summers 618, DACs 620 and RF up converters 622 for processing the downlink data streams into RF analog signals. The RF analog signals are then communicated via an analog transmit bus 624 to power amplifier 626 and antennas 628 where the RF analog signals are radiated.

Figure 7:
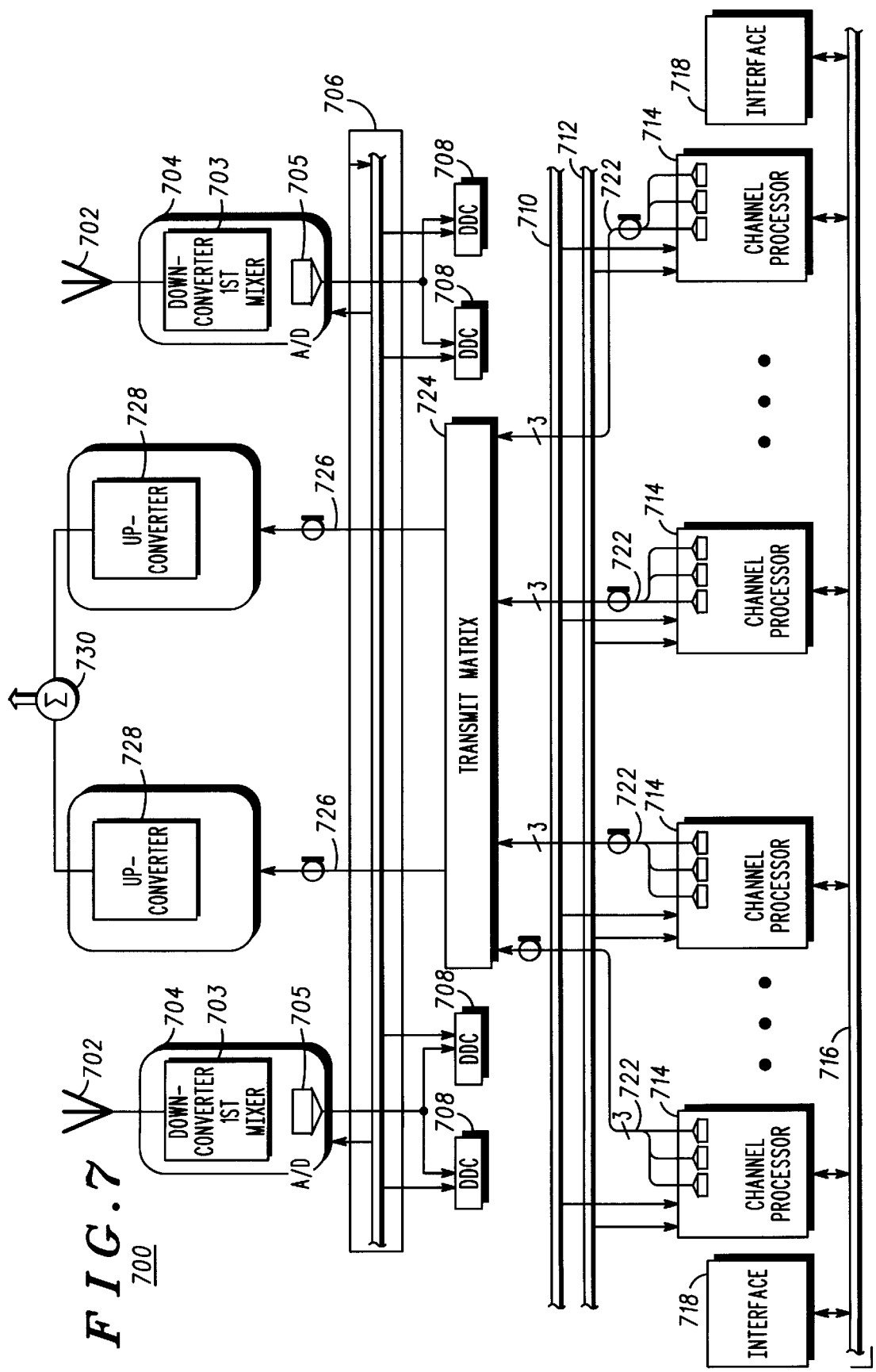
FIG. 7 is a block diagram representation of a multi-channel transceiver in accordance with another preferred embodiment of the present invention.

With reference to FIG. 7, a transceiver 700 is shown which, while also containing the functional elements described with respect to transceiver 400, provides still another architectural arrangement. Transceiver 700 is described for a single sector of a sectorized communication system. It should be appreciated that transceiver 700 is easily modified to service a plurality of sectors.

In a receive mode, RF signals are received by antennas 702 and communicated to receive RF processing shelves 704. Receive RF processing shelves 704 each contain an RF down converter 703 and an ADC 705. The output of receive RF processing shelves 704 is a high speed data stream which is communicated via high speed backplane 706 to a plurality of DDCs 708. DDCs 708 operate as previously described to select the high speed data streams and to down convert the data streams. The outputs of DDCs 708 are low speed data streams which are communicated on busses 710 and 712 to channel processors 714. Channel processors 714 operate as previously described to process a communication channel and to communicate the communication channel to the cellular network and PSTN via a channel bus 716 and network interfaces 718. The DDCs 708 of transceiver 700 may also be advantageously located on a channel processor shelf with an appropriate high speed backplane interconnect.

In a transmit mode, downlink signals are communicated from the cellular network and PSTN via interfaces 718 and channel bus 716 to the channel processors 714. Channel processors 714 include DUCs and DACs for up converting and digitizing the downlink signals to analog IF signals. The analog IF signals are communicated via coaxial cable interconnects 722, or other suitable interconnection media, to a transmit matrix 724 where the downlink signals are combined with other downlink analog IF signals. The combined analog IF signals are then communicated, via coaxial interconnects 726, to RF up converters 728. RF up converters 728 convert the IF signals to RF signals. The RF signals from up converters 728 are RF summed in summer 730 and are then communicated to power amplifiers and transmit antennas (not shown).

Figure 18:
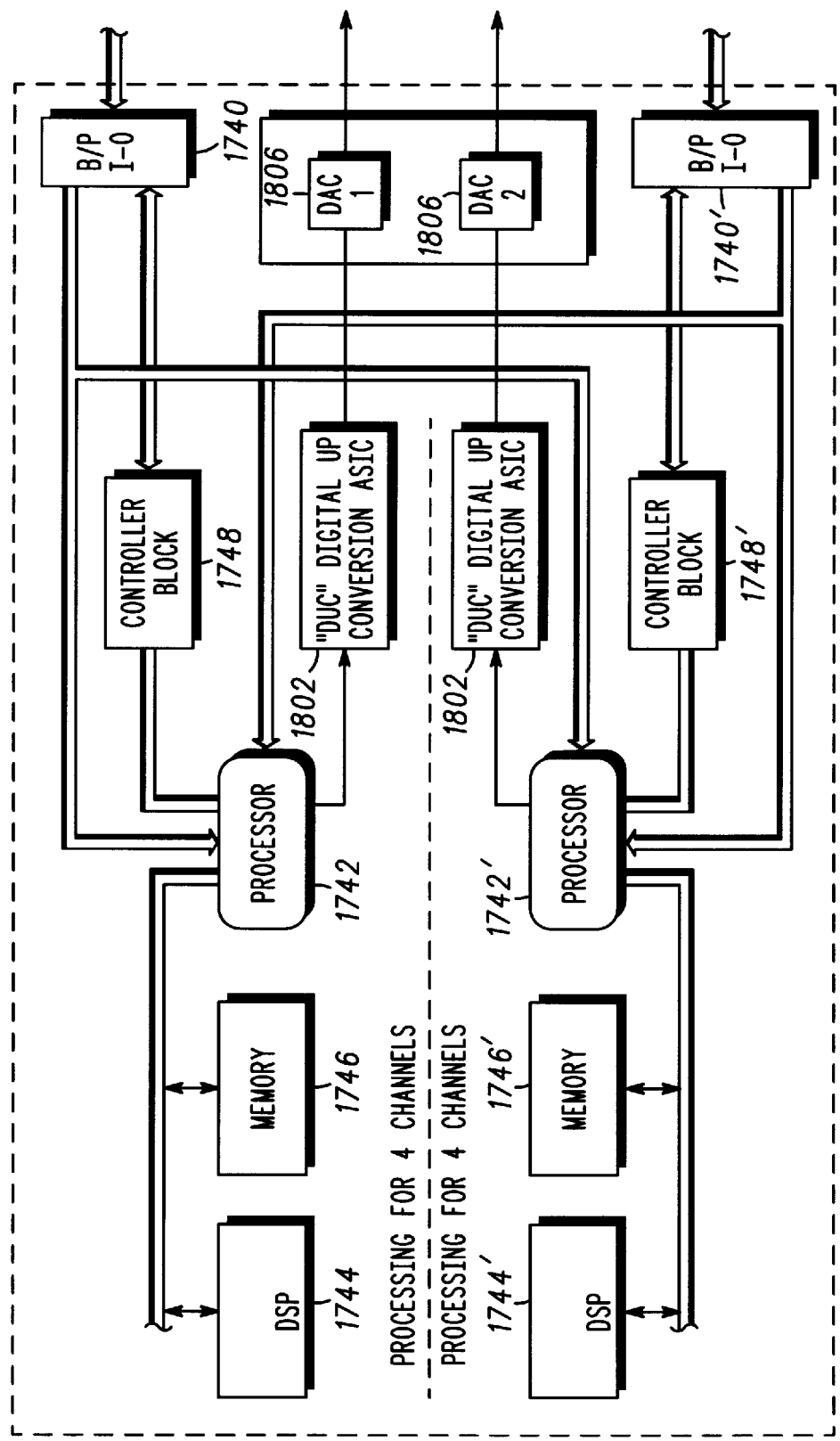
FIG. 18 is a block diagram representation of another preferred embodiment of a channel processor card in accordance with the present invention.

As will be appreciated from transceiver 700, the high speed data processing, i.e., the digital up conversion, on the downlink signals is advantageously accomplished within the channel processors 714. A preferred embodiment of a channel processor 714 is shown in FIG. 18. Channel processor 714 is similar in most aspects to channel processor 228 shown in FIG. 17 with like elements bearing like reference numeral. Channel processor 714 includes, in addition to these element, DUCs 1802 are coupled to receive downlink signals from processors 1742, 1742'. DUCs 1802 up convert the downlink signals which are communicated to DACs 1806 where the downlink signals are converted to analog IF signals. The analog IF signals are the communicated, via ports 1740, 1740', to the transmit matrix 724.

With reference to FIGS. 8, 9 and 10 further arrangements for interconnecting the elements of transceiver 400 are shown. To avoid the loss of an entire cell due to the failure of a single component, daisy chain interconnection of components is avoided. As seen in FIG. 8, and for example in the downlink arrangement, selectors 800 are provided in the DCMs 802 prior to DUCs 804 and DAC 806. Direct data links 808 are provided from DUCs 804 to selectors 800 from DCM 802 to DCM 802 and finally to DAC 806. Bypass data links 810 are also provided tapping into direct data links 808. In operation, if one or more DCMs 802 fails, selectors 800 are operable to activate the appropriate bypass data links 810 to bypass the failed DCM 802 and to allow continued communication of signals to amplifier 812 and transmit antenna 814. It should be understood that the uplink elements can be similarly connected to provide a fault tolerant receive portion of the transceiver.

FIG. 9 shows an alternate arrangement. In FIG. 9, channel processors 920 are interconnected via a TDM bus 922 to DCMs 902. DCMs are interconnected as described in FIG. 8, selectors 900 associated with each DCM 902 are not shown, it being understood that selectors may easily be implemented directly in the DCMs 902. By pass links 924 interconnecting the channel processors 920 directly to an associated DCM, and into an additional selector (not shown) within DCMs 902. In the event of the failure of a channel processor 920 bringing down TDM bus 922 or a failure of TDM bus 922 itself, the selectors within the DCMs 902 can activate the appropriate bypass link 924 to allow continued communication of signals to DAC 906, amplifier 912 and transmit antenna 914.

FIG. 10 shows still another alternate arrangement. Again, DCMs 1002 are interconnected as described in FIG. 8. In FIG. 10 direct links 1030 interconnect channel processors 820 in a daisy chain fashion, the output of each channel processor 1020 being summed in summers 1032 and then communicated to DCMs 1002 on a TDM bus 1034. By pass links 1036 forming a second bus, are provided as are selectors 1038 in a fashion similar to that shown for DCMs 802 in FIG. 8. In the event of a failure of any one of the channel processors, the signals from the remaining channel processors 1020 can be routed around the failed channel processors in the same manner as described for the DCMs 802, above to selector 1000, DAC, 1006, amplifier 1012 and antenna 1014.

The many advantages and features of the present invention will be appreciated from the foregoing description of several preferred embodiments. It should be understood, that many other embodiments, advantages and features fall within its fair scope as may be understood from the subjoined claims.

What is claimed is:

1. A transmitter in a wireless communication system, the transmitter comprising:

a numerically controlled oscillation and modulation device;

a digital switch in communication with the numerically controlled oscillation and modulation device;

a first summer responsive to the digital switch;

a second summer responsive to the digital switch;

a first upconverter responsive to the first summer, and having an output to a first sector of a base station; and a second upconverter responsive to the second summer, and having an output to a second sector of the base station.

2. The transmitter of claim 1, wherein the digital switch has a first input responsive to the numerically controlled oscillation and modulation device and a first and second output.

3. The transmitter of claim 1, further comprising a plurality of antennas, each of the plurality of antennas responsive to at least one of the first and second summers.

4. The transmitter of claim 1, wherein the numerically controlled oscillation and modulation device comprises a phase accumulator and a sinusoid generator responsive to the phase accumulator.

5. The transmitter of claim 4, wherein the numerically controlled oscillation and modulation device further comprises a summer and the phase accumulator is responsive to the summer.

* * * * *